United States Patent [19]

Placke et al.

[11] Patent Number: 4,850,657
[45] Date of Patent: Jul. 25, 1989

[54] CABINET FOR HOUSING AN ELECTRONIC TERMINAL

[75] Inventors: Dale L. Placke, Dayton; Harley J. Shawen, Kettering; Harry L. Howett, Brookville; Donald L. Adelberger, Dayton, all of Ohio

[73] Assignee: NCR Corporation, Dayton, Ohio

[21] Appl. No.: 60,585

[22] Filed: Jun. 11, 1987

[51] Int. Cl.⁴ .............................................. A47B 75/00
[52] U.S. Cl. ................................... 312/213; 98/121.1; 220/4 B; 312/223; 312/263; 312/328
[58] Field of Search ...................... 312/7.1, 7.2, 257 R, 312/215, 257 SM, 263, 213, 223, 236, 328; 98/121.1; 220/4 B, 4 E, 324

[56] References Cited

U.S. PATENT DOCUMENTS

| 786,203 | 3/1905 | Gailey | 98/121.1 X |
|---|---|---|---|
| 2,588,612 | 3/1952 | Brookins | 312/213 X |
| 3,506,322 | 4/1970 | Richards | 312/213 X |
| 4,014,598 | 3/1977 | Stalley et al. | 312/213 X |
| 4,102,554 | 7/1978 | Reimer | 312/208 X |
| 4,214,797 | 7/1980 | Borresen et al. | 108/153 X |
| 4,593,813 | 6/1986 | Powel | 220/4 B X |
| 4,652,969 | 3/1987 | Stegenga | 220/4 E X |
| 4,702,154 | 10/1987 | Dodson | 361/384 X |

Primary Examiner—Peter A. Aschenbrenner
Assistant Examiner—Thomas A. Rendos
Attorney, Agent, or Firm—Wilbert Hawk, Jr.; Albert L. Sessler, Jr.; Elmer Wargo

[57] ABSTRACT

A cabinet which houses electronic modules and provides a low-cost assembly of the modules in the cabinet. The cabinet includes a base portion, cover portion, and a locking portion which are used to prevent unauthorized persons from gaining access to critical modules within the cabinet. A vent system provides cooling while preventing objects one millimeter in diameter, or larger, from being inserted into the cabinet, as a safety measure.

18 Claims, 5 Drawing Sheets

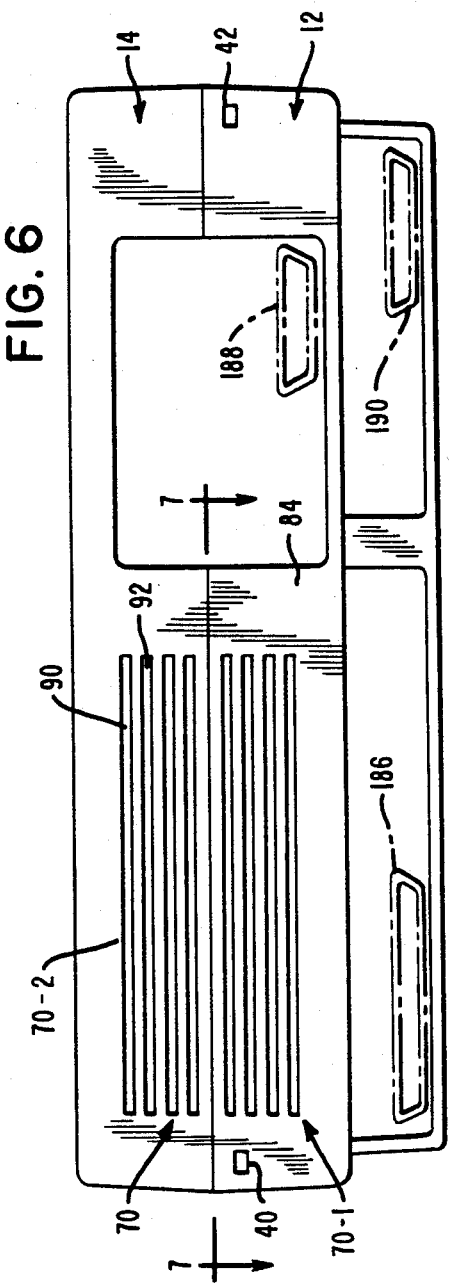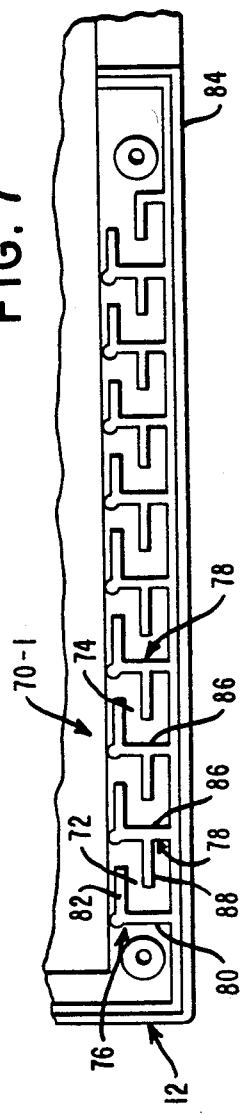

CABINET FOR HOUSING AN ELECTRONIC TERMINAL

BACKGROUND OF THE INVENTION

This invention relates to a cabinet which houses electronic modules and which is designed to provide a low cost assembly of an electronic terminal housed within the cabinet.

In recent years there has been a trend towards making the "footprint" or overall size of electronic terminals smaller when compared to earlier models. In addition, efforts are being made to reduce the cost of assembling the modules within the cabinet.

SUMMARY OF THE INVENTION

The present invention represents an improvement along the lines discussed under recent trends in the Background of the Invention. In this regard, this invention relates to a cabinet for housing electronic modules which features generally: a design which facilitates the installation of the modules to be housed in the cabinet; a lockable portion which permits only authorized persons to gain access to a particular module within the cabinet; and a vent system which provides for cooling or ventilation while preventing (as a safety feature) probes and the like from being inserted into the cabinet through the vent.

In one aspect, a preferred embodiment of this invention relates to a cabinet including: a base portion including a first wall upstanding therefrom; a cover portion having a first wall depending therefrom; and a locking portion. The base portion and the cover portion have first and second means, respectively, for cooperatively detachably securing the base portion and the cover portion together to form a closed cabinet; and the cabinet also includes locking means for locking the locking portion to the first walls of the base and cover portion to thereby form a locked cabinet. At least one of said first walls has an opening therein to receive a component having an operating end, and said operating end of said component is accessible for use by an operator only when said cabinet is unlocked and said locking portion is removed.

In another aspect, a preferred embodiment of this invention relates to a cabinet including: a three dimensional enclosure having an opening therein through which air is drawn into the enclosure; and an air outlet wall having an air baffle thereat through which air is discharged from the enclosure, with the baffle including a plurality of passageways. Each passageway includes: a first member having first and second walls joined to produce a general "L"-shaped cross section; and a second member having first and second walls joined to produce a general "L"-shaped cross section, with the first walls of the first and second members being secured to the inside of the outlet wall so that the second walls of the first and second members are in spaced and at least partially overlapping relationship. And finally, the air outlet wall has a plurality of parallel openings therein which extend across the plurality of passageways in a direction which is substantially perpendicular to the first walls of the first and second members.

The features mentioned, and others, will become more readily understood in connection with the following description, claims, and drawing.

BRIEF DESCRIPTION OF THE DRAWING

FIG. 6 is a general view, in elevation, of an air outlet wall the cabinet;

FIG. 7 is a plan view (slightly enlarged) of the base portion and is taken along the general line 7—7 of FIG. 6.

DETAILED DESCRIPTION OF THE INVENTION

Figure 1:
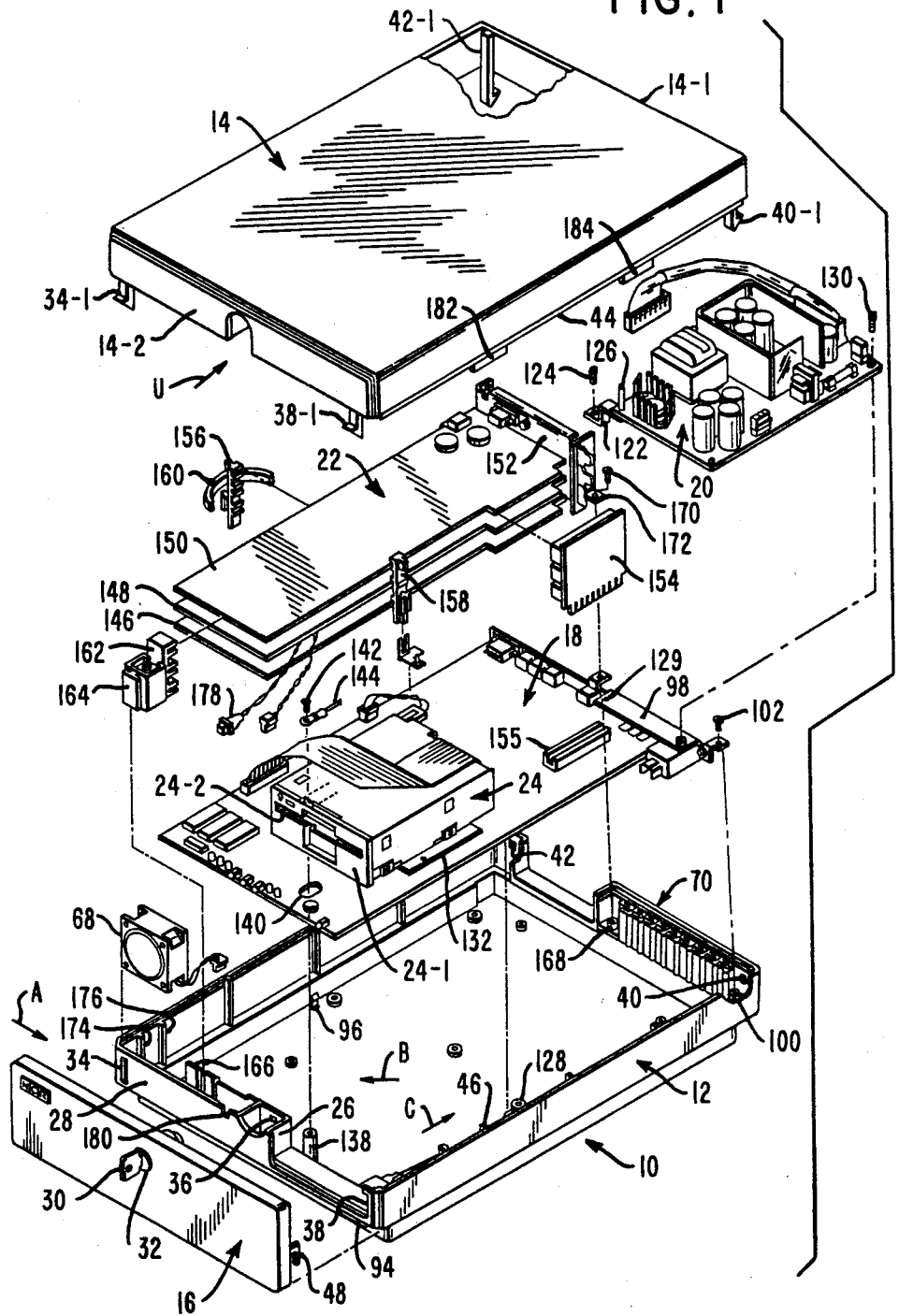
FIG. 1 an exploded view, in perspective, of a cabinet made according to this invention, showing the modules to be inserted in the cabinet and also showing the base, cover, and locking portions of the cabinet.

FIG. 1 is an exploded view, in perspective, of a cabinet which is made according to this invention and which is designated, generally, as 10. The cabinet 10 includes a base portion 12, a cover portion 14, and a locking portion 16.

As stated earlier herein, the cabinet 10 (FIG. 1) houses a plurality of modules which are mounted in the cabinet 10, as will be described later herein, to comprise an electronic terminal. In the embodiment shown, the modules include a processor controlled, main printed circuit board or "personality" board 18, a power supply module 20, an option board assembly 22 including one or more printed circuit boards which may include individual processors thereon, and a disc drive 24. Naturally, the types of components or modules and the number included in an electronic terminal are dependent upon a particular application; however, the principles of this invention may be extended to terminals other than the one shown in FIG. 1.

One of the features of the cabinet 10 is that it includes the locking portion 16 which permits only authorized persons to gain access to the interior of the cabinet 10. For example, in the embodiment shown in FIG. 1, the cabinet 10 houses a financial terminal which uses the disc drive 24 as an input device. The associated software for running the financial terminal is stored on a floppy disc which is inserted in the disc drive 24. Because the operating software is proprietary and important from the standpoint of controlling operations associated with financial records for financial institutions, for example, it must be protected from access by unauthorized persons who might be tempted to tamper with the operating software.

Figure 2:
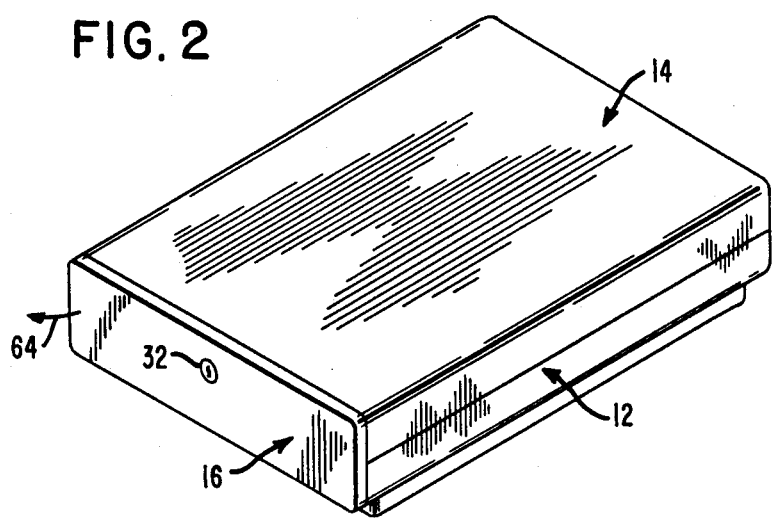
FIG. 2 is general, perspective view of the cabinet in a closed position.

The disc drive 24 (FIG. 1) is protected from unauthorized persons as follows. The disc drive 24 is mounted in the base portion 12 of the cabinet 10 so that its front or operating end 24-1 is positioned in a complementary recess 26 in a first wall 28 which is upstanding from the base portion 12. When the locking portion 16 is attached and locked, as will be described hereinafter, the operating slot 24-2 of the disk drive 24 is covered and inaccessible as shown in FIG. 2. In order to gain access to the disk unit 24, it is necessary to use a key 30 (FIG. 1) in a lock 32 to unlock the locking portion 16 and thereafter, pivot it away from the first wall 28 of the base portion 12.

Before discussing additional details of the cabinet 10, it appears appropriate to describe how the base portion 12, cover portion 14, and locking portion 16 are fitted together to form the flush appearance shown in FIG. 2. In this regard, the base portion 12 and the cover portion 14 have first and second means, respectively, for cooperatively, detachably securing these two portions together. The first means associated with the base portion 12 includes a plurality of openings 34, 36, 38, 40, and 42 therein as shown in FIG. 1. The second means associated with the cover portion 14 includes a plurality of resilient detents 34-1, 36-1 (FIG. 3), 38-1, 40-1, and 42-1 which are integrally formed with the cover portion 14.

Figure 3:
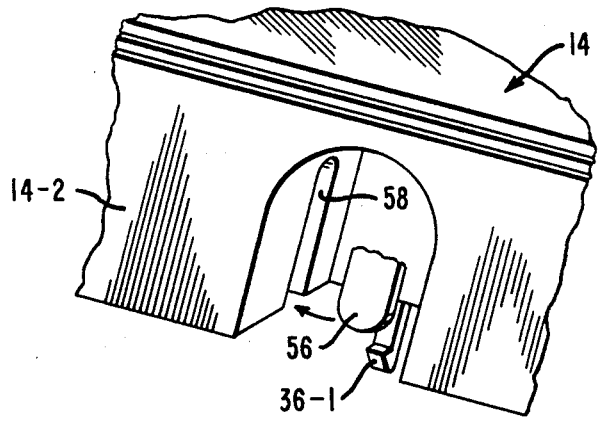
FIG. 3 is an enlarged view, in perspective, of a portion of the cover portion when looking in the direction of arrow U of FIG. 1.

The detents 34-1, 36-1, 38-1, 40-1 and 42-1 are shown in exaggerated size in FIGS. 1 and 3 so as to facilitate a showing of their shapes. To assemble the cover portion 14 to the base portion 12, the detents 34-1, 36-1, and 38-1 are aligned with their mating openings 34, 36, and 38. This procedure is facilitated by raising the rear edge 14-1 of the cover portion 14 while positioning the detents 34-1, 36-1, and 38-1 under the upper edges (as viewed in FIG. 1) of their associated holes 34, 36, and 38, respectively. Thereafter, the cover portion 14 is pivoted slightly (via the detents 34-1, 36-1, and 38-1) in a clockwise direction (as viewed in FIG. 1) until the detents 40-1 and 42-1 are aligned with their mating holes 40 and 42. When so aligned, the cover portion 14 is simply pushed downwardly or "hit" downwardly with a hand to cause the resilient detents 40-1 and 42-1 to slip under the upper edges of openings 40 and 42 to thereby lock the cover portion 14 to the base portion 12. The cover portion 14 also has a recessed edge or lip 44 which extends around the perimeter of the cover portion 14, with the lip 44 fitting inside a complementary recess 46 which extends around the inside perimeter of the base portion 12. The lip 44 and the recess 46 provide rigidity for the cabinet 10. The cover portion 14 has a first wall 142 depending therefrom so that when the cabinet 10 is in the assembled relationship shown in FIG. 2, the locking portion 16 will extend along the combined height of the first wall 14-2 of the cover portion 14 and the first wall 28 of the base portion 12 as shown in FIG. 2.

After the cover portion 14 and the base portion 12 have been assembled as described, the locking portion 16 (FIG. 1) is attached thereto as follows. The locking portion 16 has two resilient detent members 48 (FIG. 1) and 50 (FIG. 4) extending from the inner side thereof, and they are integrally formed with the locking portion 16. Because the detent members 48 and 50 are similar, an explanation will be given of only detent member 50.

The detent members 48 and 50 (FIG. 4) perform the function of enabling the locking portion 16 to pivot on the base portion 12, and they also perform an anti-break-in function to be later described herein. The detent member 50 has a half sphere 52 positioned on a side thereof to cooperate with a complementary recess 54 (FIG. 5) formed in the base portion 12. To assemble the locking portion 16 to the base portion 12, the resilient detent members 48 and 50 are pushed slightly towards each other and inserted in their respective openings 34 and 38. Thereafter, the half sphere 52 is positioned in the opening 54 (FIG. 4) and the half sphere (not shown) on the detent member 48 is placed in a complementary recess (similar to recess 54 but not shown) in the base portion 12. When the detent members 48 and 50 are released, they then enable the locking portion 16 to pivot in the recesses, like 54 in the base portion 12. When the locking portion 16 is pivoted to the closed position shown in FIG. 2, the key 30 may be rotated to cause a conventional blade 56 (shown only partially in FIG. 3) to move into locking engagement with a slot 58 (FIG. 3) in the cover portion 14.

Figure 4:
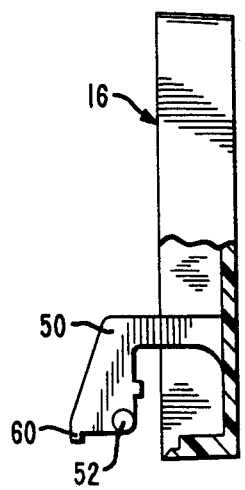
FIG. 4 is an end view, taken from the direction of arrow A in FIG. 1, to show additional details of the portion.
Figure 5:
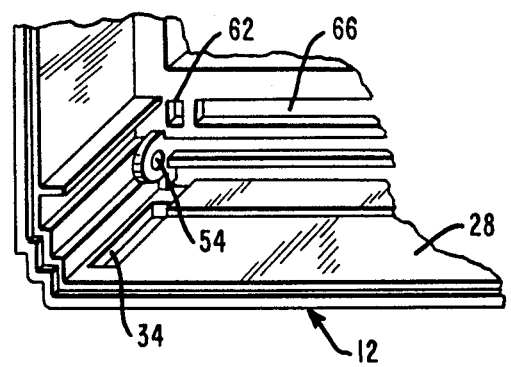
FIG. 5 is a general perspective view, taken along the direction of arrow B in FIG. 1, to show how detents on the locking portion are secured to the base portion of the cabinet.

The anti-break-in function, alluded to earlier herein with regard to the locking portion 16, refers to the possibility that the cabinet 10 (on some earlier embodiments) could be broken into even though it was locked as just described. To avoid this problem, each of the detent members 48 and 50 has an extension 60 depending therefrom as shown in FIG. 4. When the locking portion 16 is pivoted to the closed portion shown in FIG. 2, the extension 60 on the detent member 50, for example, moves into the complementary recess 62 in the base portion 12 (FIG. 5). A corresponding situation exists for the detent member 48 although it is not shown in the drawing. With the structure just described, it is not possible to pull the lower edge of the locking portion 16 (as viewed in FIG. 2) in the direction of arrow 64 to remove the locking portion 16 even though it is locked, to thereby gain access to the cabinet 10.

Another feature of this invention relates to a vent system which permits ventilation and cooling of the modules within the cabinet 10. In this regard, air comes into the cabinet 10 through a grate-type opening 66 (FIG. 5) near the bottom of the base portion 12, is moved through the cabinet 10 via a blower 68, and exits through an air baffle 70 at the rear end of the cabinet 10.

The air baffle 70 is designed to permit air to move therethrough; however, it is also designed, from a safety standpoint, to prevent any object like a rod having a diameter of one millimeter or greater from being inserted through the air baffle. Some current safety standards require that the vent system be designed to prevent any object larger than 3/16 inch diameter from being inserted through the vent system.

The air baffle 70 is located in the air outlet or rear wall of the cabinet as shown in FIG. 6. In the embodiment described, the air baffle 70 is comprised of a first baffle section 70-1 which is located in an upstanding wall of the base portion 12 of the cabinet and is also comprised of a second baffle section 70-2 which is located in a depending wall of the cover portion 14. The first baffle section 70-1 and the second baffle section 70-2 of the air baffle 70 are similar; consequently, only a description of the first baffle section 70-1 need be given.

FIG. 7 shows the cross sectional shape of the first baffle section 70-1 which includes a plurality of passageways like 72 and 74. Each said passageway, like 72, includes a first member 76 and a second member 78 which are positioned as shown in FIG. 7. The first member 76 has a first wall 80 and a second wall 82 which are joined to produce a general "L"-shaped cross section, with the first wall 80 being secured to the inside of the air outlet wall 84. The second member 78 also has a first wall 86 and a second wall 88 which are joined to produce a general "L"-shaped cross section, with the first wall 86 being secured to the inside of the air outlet wall 84. In the embodiment described, the first walls 80 and 86 have some commonality and they are integrally formed with the base portion 12. Notice that the second walls 82 and 88 of the first and second members 76 and 78, respectively, are in slightly overlapping relationship.

The air outlet wall 84 (FIG. 6) also has a plurality of parallel slots, like 90 and 92, therein which are aligned to be parallel with the base of the base portion 12 and substantially perpendicular to the first walls 80 and 86. The second baffle section 70-2 is identical to first baffle section 70-1 just described.

In the embodiment described, the corresponding first and second members (like 76 and 78 of the first section 70-1) associated with second section 70-2 are aligned with the first and second members 76 and 78 of the first section 70-1. The size of the passageways, like 72 and 74, and the number of such passageways are determined, conventionally, by the amount of heat generated by the modules within the cabinet 10 and the amount of air flow through the cabinet required for cooling. In the embodiment described, the size of the cabinet 10 is approximately 11"×16"×4" high. The length of the first wall 80 is about ⅜ of an inch while the length of the second wall 82 is approximately ¼ of an inch. The length of the second wall 88 associated with the second member 78 is about 5/16 of an inch. The depth of the first and second members 76 and 78, as measured along the height of the cabinet 10 is about 1 3/16 inches. The width of the slots, like 90 and 92, is about ⅛ of an inch, and in the embodiment described, there are four such slots having a length of approximately 4⅞ inches. With the dimensions described, a rod having a diameter of one millimeter or greater cannot be inserted through the air baffle 70.

Figure 8:
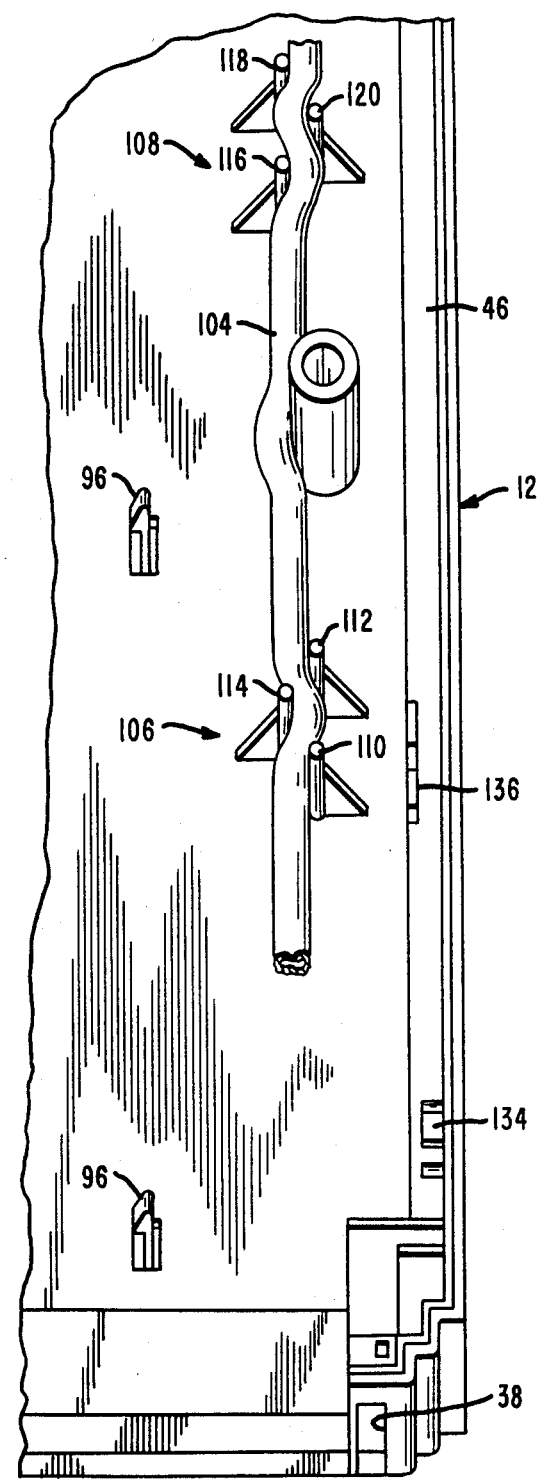
FIG. 8 is a general view, in perspective, of a portion of the base portion, with the view being taken from the general direction of arrow C in FIG. 1.

As previously stated herein, another feature of this invention relates to a design which facilitates the installation of modules to be housed within the cabinet 10. In this regard, the general sequence for installing the modules within the cabinet 10 (FIG. 1) is as follows:

1. An off-on switch 94 (FIG. 1) is, simply pushed into an opening in the base portion 12 and held therein by conventional, resilient detents;

2. The personality board 18 is detachably secured to the inside base of the base portion 12 by four resilient detents, like detent 96, to grasp opposed sides of the personality board 18;

3. The AC harness 104 (FIG. 8) is run from the switch 94 (FIG. 1) through a line filter to the power supply module 20 which will be positioned near the air baffle 70. Instead of using tie down clamps and the like, the cabinet 10 includes retainer means 106 and 108 for retaining the AC harness 104 to the base portion 12. The retainer means 106 includes first, second and third posts 110, 112 and 114 which are upstanding from the base portion 12 as shown in FIG. 8. In a preferred embodiment, the centers of posts 110, 112 and 114 are positioned to form an imaginary isosceles triangle, with the distance between the posts 110 and 112 representing the longest side of the imaginary triangle. The AC harness 104 is simply pushed down between the posts 110, 112 and 114 to form the serpentine shape shown, and in the process, the AC harness 104 is retained on the floor of the base portion 12. The retainer means 108 is similar to retainer means 106 except, of the three posts 116, 118 and 120, the distance between posts 116 and 118 represents the longest dimension of the associated isosceles triangle;

4. The personality board 18 also has a metal frame 98 (FIG. 1) on one side thereof which is secured to a threaded boss 100 upstanding from the base portion 12 by a screw 102. The metal frame 98 provides the chassis ground for the cabinet 10. All the modules are "grounded" to this frame 98;

5. The power supply module 20 is next installed in the cabinet 10. In this regard, a bracket 122 has one end secured to the center of the personality board 122 by a fastener 124, and the remaining end has a resilient detent 126 upstanding therefrom. A similar detent (not shown) is upstanding from the boss 128 and another one passes through a hole 129 in the metal frame 98. The power supply module 20 is detachably secured to the detents mentioned, and a fastener 130 is used to secure the remaining corner of the module 20 to the metal frame 98;

6. The disc drive 24 is then installed in the cabinet 10. In this regard, the disc drive 24 has opposed mounting flanges, like 132 shown in FIG. 1. The flange 132 is inserted in the cabinet 10 by having the flange 132 slide under a lip 134 (FIG. 8) and abut against a projection 136, both of which are formed in the base portion 12. The flange 132 prevents the disc drive 24 from moving upwardly in the cabinet 10, and the projection 136 prevents the disc drive 24 from moving rearwardly while the front end 24-1 is positioned in the opening 38 of the cabinet 10. The flange (not shown) opposed to flange 132 is secured to a boss 138 (FIG. 1) which is upstanding from the base portion 12. The personality board 18 has a hole 140 (FIG. 1) therein to permit the boss 138 to pass therethrough. A single fastener 142 is then used to threadedly secure the flange (similar to flange 132) to the boss 138. A grounding lug 144, positioned under the fastener 142, provides a ground connection for the disc drive 24;

7. The option board assembly 22 shown in FIG. 1 is assembled in a separate, prior operation before it is inserted in the cabinet 10. In this regard, there are three printed circuit boards 146, 148 and 150 (in the embodiment shown) assembled to a mounting plate 152. A terminal connector block 154 connects each one of the printed circuit boards 146, 148 and 150 to the personality board 18 (via a mating connector block 155) when installed in the cabinet 10. To facilitate installation, the three printed circuit boards 146, 148 and 150 are maintained in spaced, parallel relationship by the supports 156 and 158. These supports 156 and 158 are maintained against the printed circuit boards 146, 148 and 150 by a rubber band or "O"-ring 160 positioned around both supports 156 and 158 but shown only around support 156. A support 162 is inserted on the option board assembly 22 prior to insertion in the cabinet 10. The support 162 has a mounting flange 164 which fits into a complementary recess 166 in the base portion 12. The mounting plate 152 has an "L"-shaped bracket (not shown) which slides downwardly into a complementary recess (near opening 42) as mounting flange 164 slides downwardly into its recess 166. Thereafter, the option board assembly 22 is secured to a boss 168 in the base portion by a single fastener 170 which passes through a mounting flange 172 of the mounting plate 152;

8. The blower 68 is then slid between two vertically aligned ribs 174 and 176 in the base portion 12 and the support 162 which is already in position. There is a rib (not shown) on the underside of the cover portion 14 which is positioned to press against the top of the blower 68 (as viewed in FIG. 1) to hold the blower 68 in place when the cover portion 14 is put place, as previously described;

9. A "hypo" switch 178 (FIG. 1) associated with the disc drive 24 is placed in a receiving notch 180 in the base portion 12. The switch 178 also includes a light emitting diode (LED), with the switch 178 being used to switch the disc drive 24 between single density and double density modes of operation;

10. The various harnesses are hooked up to their associated modules, as is conventionally done;

11. The cover portion 14 is assembled to the base portion 12, as previously described; and 12. The locking portion 16 is then assembled to the base portion 12 and locked, as previously described.

The inside of the cabinet 10 is sprayed with a conductive material (not shown) to contain any electronic noise which might be generated by the electronic modules within the cabinet 12. In this regard, the cover portion 14 has four depending fingers like 182 and 184 (only two are shown in Fig. 1) to contact the interior of the base portion 12 and provide electrical continuity therebetween.

The cabinet 10 itself is made of a plastic material called NORYL PC 180 which is manufactured by General Electric. The base portion 12, cover portion 14, and the locking portion 16 are made of the named plastic material and are molded with the various, detents, recesses, etc. mentioned. The rear of the cabinet 10 (FIG. 6) has various connectors like 186, 188 and 190, which are simply representative of connectors for coupling the electronic terminal in the cabinet 12 to other modules such as a keyboard, video monitor, and the like.

What is claimed is:

1. A cabinet comprising:

a base portion including a first wall upstanding therefrom;

a cover portion having a first wall depending therefrom; and a locking portion;

said base portion and said cover portion having first and second means, respectively, for cooperatively detachably securing said base portion and said cover portion together to form a closed cabinet; and locking means for locking said locking portion to said first walls of said base and cover portions to thereby form a locked cabinet;

at least one of said first walls having an opening therein to receive a component having an operating end; and said operating end of said component being accessible for use by an operator only when said cabinet is unlocked and said locking portion is removed.

2. The cabinet as claimed in claim 1 in which said cabinet houses an electronic terminal and in which said component is a disc unit with said operating end having a slot therein to receive a disc in said disc unit.

3. A cabinet comprising:

a base portion including a first wall upstanding therefrom;

a cover portion having a first wall depending therefrom; and a locking portion;

said base portion and said cover portion having first and second means, respectively, for cooperatively detachably securing said base portion and said cover portion together to form a closed cabinet;

locking means for locking said locking portion to said first walls of said base and cover portions to thereby form a locked cabinet;

said cabinet having at least one of said first walls having an opening therein to receive a component having an operating end;

said operating end of said component being accessible for use by an operator only when said cabinet is unlocked and said locking portion is removed;

said cabinet housing an electronic terminal and said component being a disc unit with said operating end having a slot therein to receive a disc in said disc unit;

said first and second means enabling said cover portion to be detachably hinged to said base portion near said first wall of said base portion;

said base portion having at least one retainer means formed therein for retaining a cable to said base portion;

said retainer means comprising first, second, and third posts upstanding from said base portion and positioned to cause said cable to assume a serpentine shape when said cable is pushed towards said base portion.

4. The cabinet as claimed in claim 3 in which said first, second, and third posts have centers which are positioned to form an imaginary triangle.

5. The cabinet as claimed in claim 3 in which said imaginary triangle is an isosceles triangle.

6. A cabinet comprising:

a base portion including a first wall upstanding therefrom;

a cover portion having a first wall depending therefrom; and a locking portion;

said base portion and said cover portion having first and second means, respectively, for cooperatively detachably securing said base portion and said cover portion together to form a closed cabinet;

locking means for locking said locking portion to said first walls of said base and cover portions to thereby form a locked cabinet;

said cabinet having at least one of said first walls having an opening therein to receive a component having an operating end;

said operating end of said component being accessible for use by an operator only when said cabinet is unlocked and said locking portion is removed;

said cabinet housing an electronic terminal and said component being a disc unit with said operating end having a slot therein to receive a disc in said disc unit;

said disc unit having first and second mounting flanges on opposed sides thereof and said base portion having first and second projections extending therefrom to prevent said first mounting flange from moving in first and second directions which are mutually perpendicular to each other;

said base portion having a threaded boss upstanding therefrom to receive a threaded fastener which secures said second mounting flange to said threaded boss to enable said disc unit to be retained in said cabinet with a single said threaded fastener.

7. A cabinet comprising:

a base portion including a first wall upstanding therefrom;

a cover portion having a first wall depending therefrom; and a locking portion;

said base portion and said cover portion having first and second means, respectively, for cooperatively detachably securing said base portion and said cover portion together to form a closed cabinet;

locking means for locking said locking portion to said first walls of said base and cover portions to thereby form a locked cabinet;

said first and second means enabling said cover portion to be detachably hinged to said base portion near said first wall of said base portion;

said base portion having first and second openings therein and in which said locking means includes:

first and second spaced members secured to said locking portion to cooperate with said first and second openings in said base portion to enable said locking portion to be detachably pivotally mounted on said base portion;

said locking portion having a key lock and locking blade moveable between locked and unlocked positions;

said cover portion having a slot therein to receive said locking blade when said key lock is moved to said locked position to thereby lock said locking portion to said first walls of said base and cover portions.

8. A cabinet comprising:
a base portion including a first wall upstanding therefrom;
a cover portion having a first wall depending therefrom; and
a locking portion;
said base portion and said cover portion having first and second means, respectively, for cooperatively detachably securing said base portion and said cover portion together to form a closed cabinet; and
locking means for locking said locking portion to said first walls of said base and cover portions to thereby form a locked cabinet;
said cabinet also including electronic components housed therein and in which at least one of said first walls of said base and cover portions has an opening therein through which air may be drawn into said cabinet;
at least one of said base and cover portions having an air outlet wall having an air baffle located thereat;
said air baffle including at least one passageway;
said passageway comprising:
a first member having first and second walls joined to produce a general "L"-shaped cross section;
a second member having first and second walls joined to produce a general "L"-shaped cross section;
said first walls of said first and second members being secured to the inside of said air outlet wall so that the second walls of said first and second members are in spaced and at least partially overlapping relationship;
said air outlet wall having at least one slot therein between said first walls of said first and second members to permit air to be discharged through said passageway; and
said air outlet wall being positioned opposite said locking portion.

9. The cabinet as claimed in claim 8 in which said first and second members and said one slot are dimensioned and positioned to prevent the insertion of an object like a rod having a diameter of one millimeter or greater through said baffle.

10. The cabinet as claimed in claim 9 in which said one slot is positioned substantially perpendicularly to said first walls of said first and second members.

11. The cabinet as claimed in claim 10 in which said first walls of said first and second members are integrally formed with said air outlet wall.

12. A cabinet comprising:
a three dimensional enclosure having an air inlet wall having an opening therein through which air is drawn into said enclosure;
an air outlet wall having an air baffle thereat through which air is discharged from said enclosure; and
moving means for moving air from said opening in said air inlet wall through said enclosure and through said air baffle in said outlet wall;
said baffle including at least one passageway;
said passageway comprising:
a first member having first and second walls joined to produce a general "L"-shaped cross section;
a second member having first and second walls joined to produce a general "L" shaped cross section;
said first walls of said first and second members being secured to the inside of said outlet wall so that the second walls of said first and second members are in spaced and at least partially overlapping relationship; and
said air outlet wall having at least one slot therein between said first walls of said first and second members to permit air to be discharged through the passageway.

13. The cabinet as claimed in claim 12 in which said first and second members and said one slot are dimensioned and positioned to prevent the insertion of an object like a rod having a diameter of one millimeter or greater through said baffle.

14. The cabinet as claimed in claim 13 in which said one slot is positioned substantially perpendicularly to said first walls of said first and second members.

15. A cabinet comprising:
a three dimensional enclosure having an air inlet wall having an opening therein through which air is drawn into said enclosure; and
an air outlet wall having an air baffle thereat through which air is discharged from said enclosure;
said baffle including a plurality of passageways;
each said passageway comprising:
a first member having first and second walls joined to produce a general "L"-shaped cross section;
a second member having first and second walls joined to produce a general "L"-shaped cross section;
said first walls of said first and second members being secured to the inside of said outlet wall so that the second walls of said first and second members are in spaced and at least partially overlapping relationship; and
said air outlet wall having a plurality of parallel openings therein which extend across said plurality of passageways in a direction which is substantially perpendicular to said first walls of said first and second members.

16. A cabinet comprising:
a base portion and a cover portion when positioned together forming a three dimensional enclosure;
said base portion and said cover portion each having a first wall forming a front wall of said cabinet;
said base portion and said cover portion each having a second wall forming a rear wall of said cabinet;

said base portion and said cover portion having first and second means, respectively, for cooperatively detachably securing said base portion and said cover portion together to form said three dimensional enclosure;

said front wall having an opening through which air may be drawn into said three dimensional enclosure;

said rear wall of said cabinet having a baffle thereat through which air is discharged from said three dimensional enclosure;

said second walls of said base portion and said cover portion each having a plurality of passageways therein forming said baffle;

each said passageway comprising:

a first member having first and second walls joined to produce a general "L"-shaped cross section;

a second member having first and second walls joined to produce a general "L"-shaped cross section;

said first walls of said first and second members being secured to the inside, respectively, of said second walls of said base and cover portions so that the second walls of said first and second members are in spaced and in at least partially overlapping relationship; and said second walls of said base portion and said cover portion each having a plurality of slots therein in spaced parallel relationship to one another and being substantially perpendicular to said first walls of said first and second members so as to permit air to pass through said plurality of passageways;

said cabinet further comprising:

a locking portion; and locking means for locking said locking portion to said front wall of said cabinet.

17. The cabinet as claimed in claim 16 in which said first and second members and said plurality of slots are dimensioned and positioned to prevent the insertion of an object like a rod having a diameter of one millimeter or greater through said baffle.

18. The cabinet as claimed in claim 17 in which said base portion and said cover portion each have aligned mounting means for mounting a blower therebetween when said base portion and said cover portion are secured together to form said three dimensional enclosure.

* * * * *